United States Patent
Jung

(10) Patent No.: US 7,964,959 B2
(45) Date of Patent: Jun. 21, 2011

(54) SEMICONDUCTOR CHIP, METHOD OF FABRICATING THE SAME AND STACKED PACKAGE HAVING THE SAME

(75) Inventor: Oh-Jin Jung, Bucheon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 316 days.

(21) Appl. No.: 12/191,632

(22) Filed: Aug. 14, 2008

(65) Prior Publication Data
US 2009/0045487 A1 Feb. 19, 2009

(30) Foreign Application Priority Data
Aug. 16, 2007 (KR) .......... 10-2007-0082079

(51) Int. Cl.
*H01L 23/34* (2006.01)
(52) U.S. Cl. ........ 257/713; 257/621; 257/675; 257/706; 257/712; 257/E23.051; 257/E23.08
(58) Field of Classification Search .................. 257/621, 257/675, 706, 712, 713, E23.051, E23.08
See application file for complete search history.

(56) References Cited

U.S. PATENT DOCUMENTS

| | | | | |
|---|---|---|---|---|
| 6,226,183 B1 * | 5/2001 | Weber et al. | ................... | 361/704 |
| 6,548,338 B2 * | 4/2003 | Bernstein et al. | ............. | 438/210 |
| 6,962,867 B2 * | 11/2005 | Jackson et al. | ................ | 438/622 |
| 7,295,441 B1 * | 11/2007 | Laio et al. | ..................... | 361/719 |
| 7,489,037 B2 * | 2/2009 | Chien et al. | ................... | 257/737 |
| 2004/0201095 A1 * | 10/2004 | Palmer et al. | ................. | 257/700 |
| 2004/0245630 A1 * | 12/2004 | Huang et al. | .................. | 257/737 |
| 2008/0122061 A1 * | 5/2008 | Edwards | ...................... | 257/690 |

* cited by examiner

*Primary Examiner* — Andy Huynh
(74) *Attorney, Agent, or Firm* — Sherr & Vaughn, PLLC

(57) ABSTRACT

A semiconductor chip, a method of fabricating the same and a stacked package having the same are disclosed. The semiconductor chip includes a wafer, a semiconductor device disposed on the wafer, an insulating layer covering the semiconductor device and disposed on the wafer, a deep via formed to penetrate the wafer and the insulating layer, and a heat dissipation member spaced at a predetermined interval from the deep via and penetrating at least a portion of the insulating layer for dissipating heat generated by the deep via.

5 Claims, 6 Drawing Sheets

SEMICONDUCTOR CHIP, METHOD OF FABRICATING THE SAME AND STACKED PACKAGE HAVING THE SAME

The present application claims priority under 35 U.S.C. §119 to Korean Patent Application No. 10-2007-0082079 (filed on Aug. 16, 2007), which is hereby incorporated by reference in its entirety.

BACKGROUND

Portable electronic products have rapidly been increased in the market. Due to a high demand for achieving portable electronic products having high integration, components mounted in the portable electronic product should become lightweight and thin. In order to meet such demands, a need exists for a system-on-chip (SOC) technology making a plurality of individual semiconductor chips into a single chip and a system-in-package integrating a plurality of individual semiconductor chips into a single package. When integrating a plurality of individual semiconductor chips into a single package, excess heat is generated by the semiconductor chips, which thereby results in reduced performance and reliability between the chips disposed within the package.

SUMMARY

Embodiments relate to a semiconductor chip that can efficiently discharge heat generated from a deep via provided in the semiconductor chip, thereby improving performance and reliability of the semiconductor chip.

Embodiments relate to a semiconductor chip that may include at least one of the following: a wafer; a semiconductor device disposed on and/or over the wafer; an insulating layer covering the semiconductor device and disposed on and/or over the wafer; a deep via formed to penetrate the wafer and the insulating layer; and a heat dissipation member spaced at a predetermined spatial interval from the deep via, penetrating at least a portion of the insulating layer to dissipate heat generated by the deep via.

DRAWINGS

Figure 1:
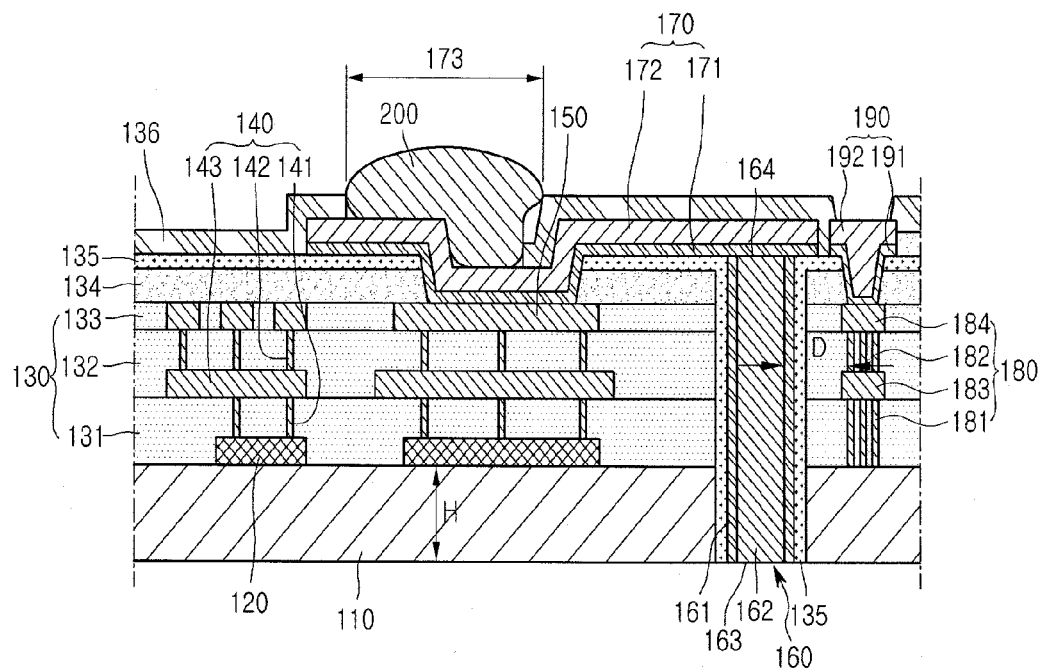
Figure 2A:
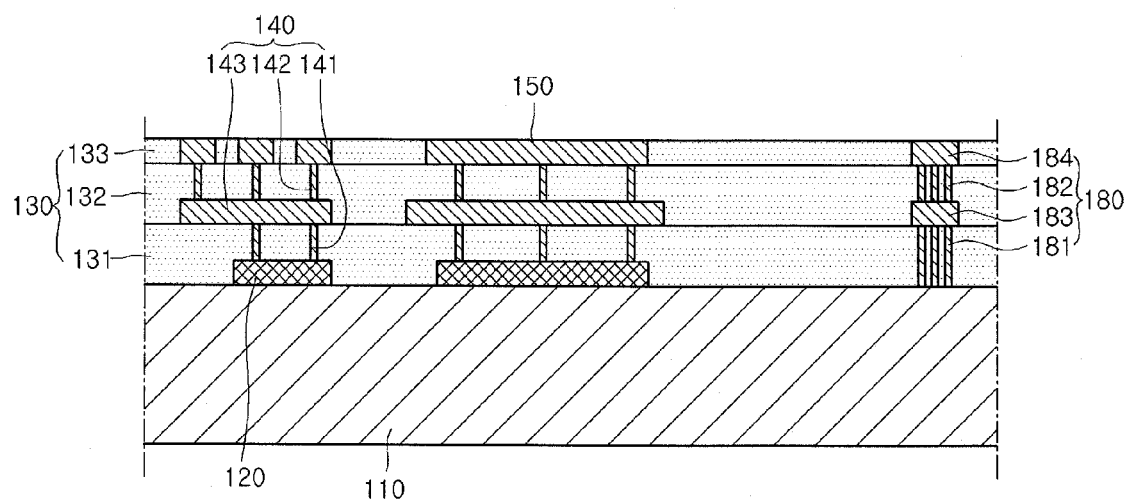
Figure 2B:
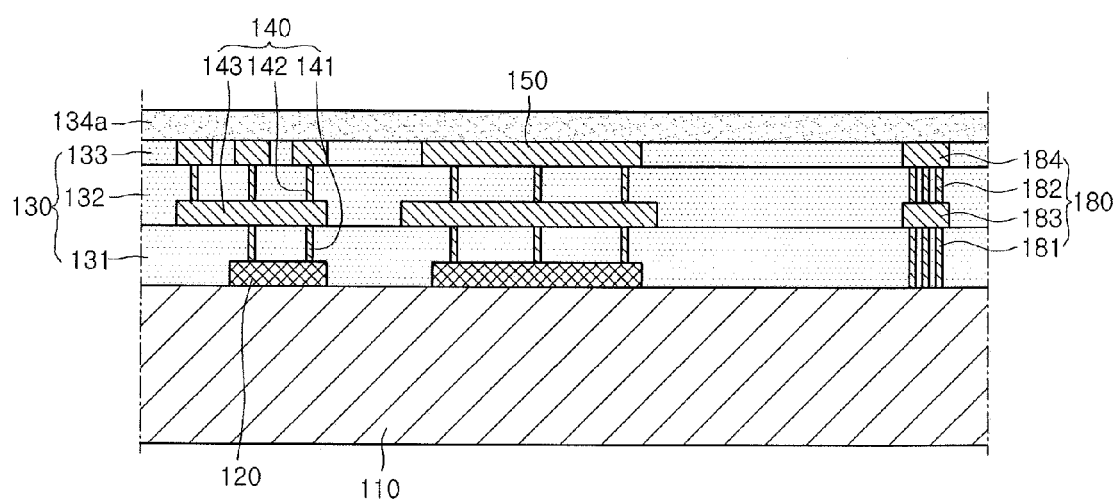
Figure 2C:
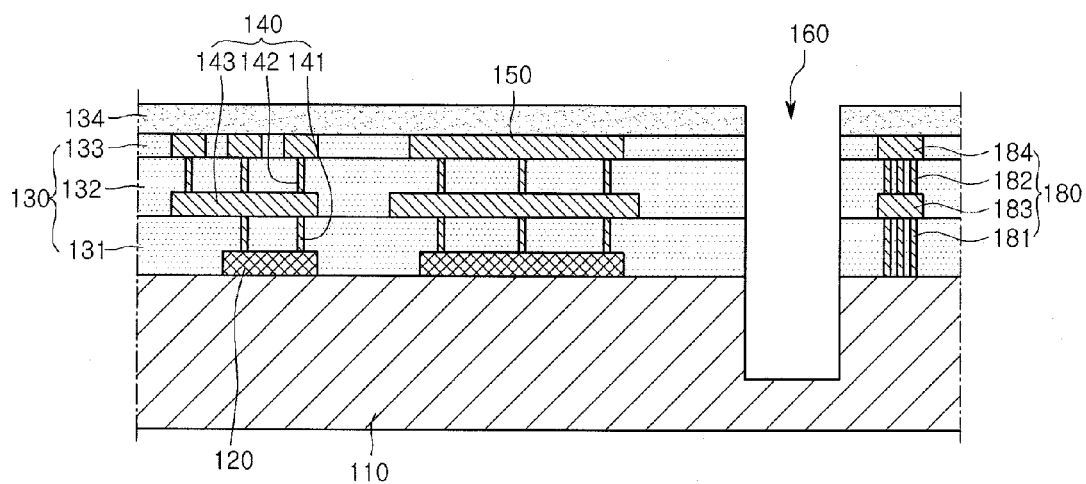
Figure 2D:
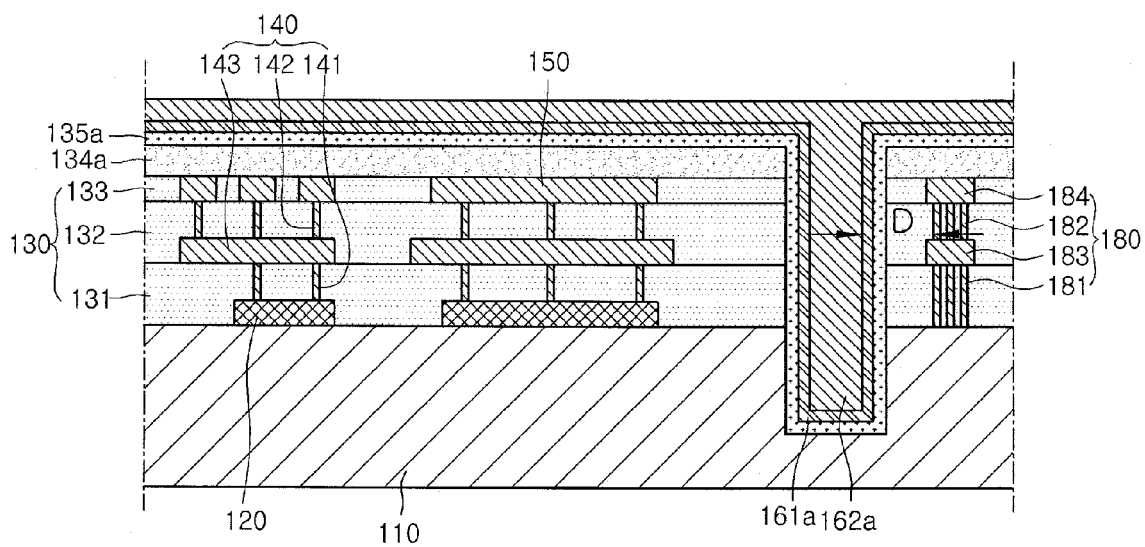
Figure 2E:
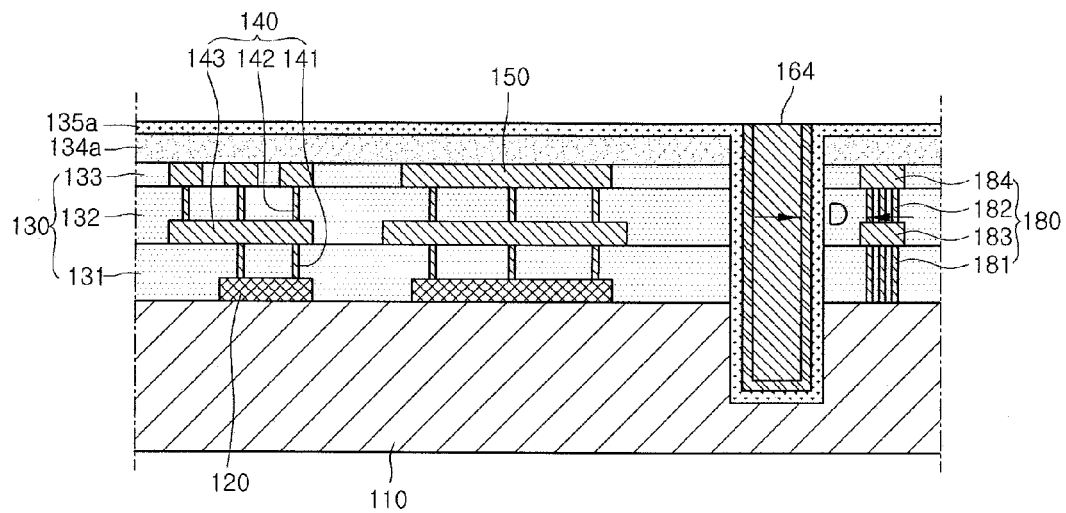
Figure 2F:
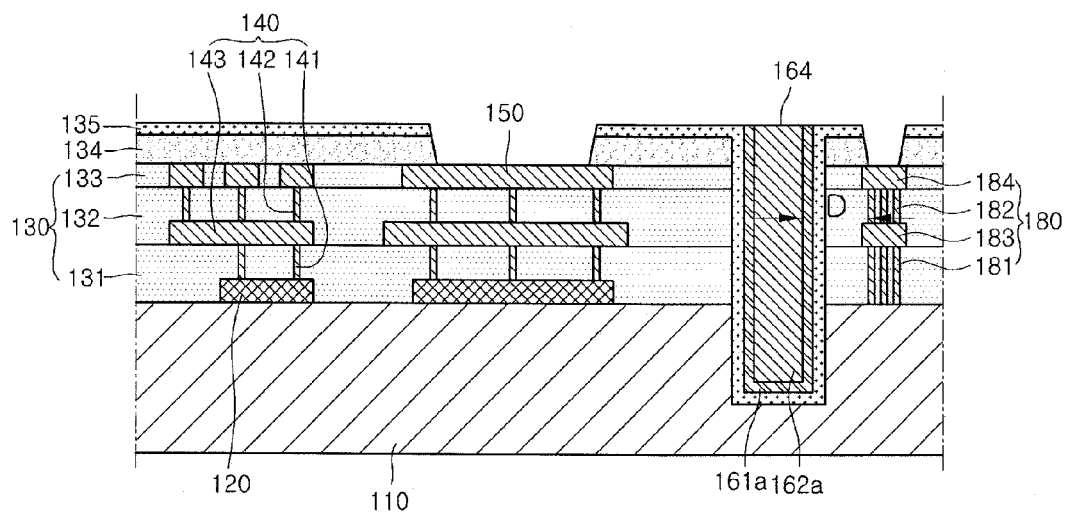
Figure 2G:
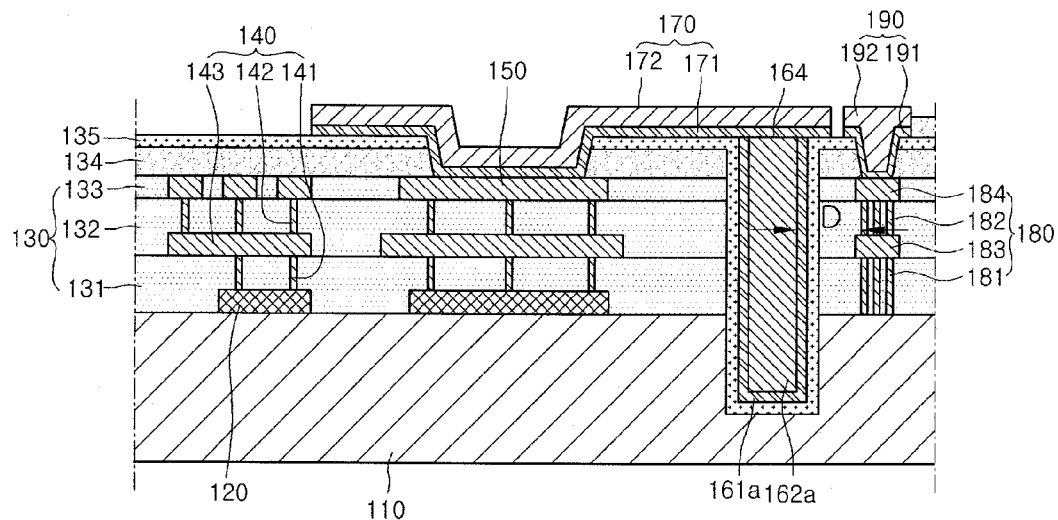
Figure 2H:
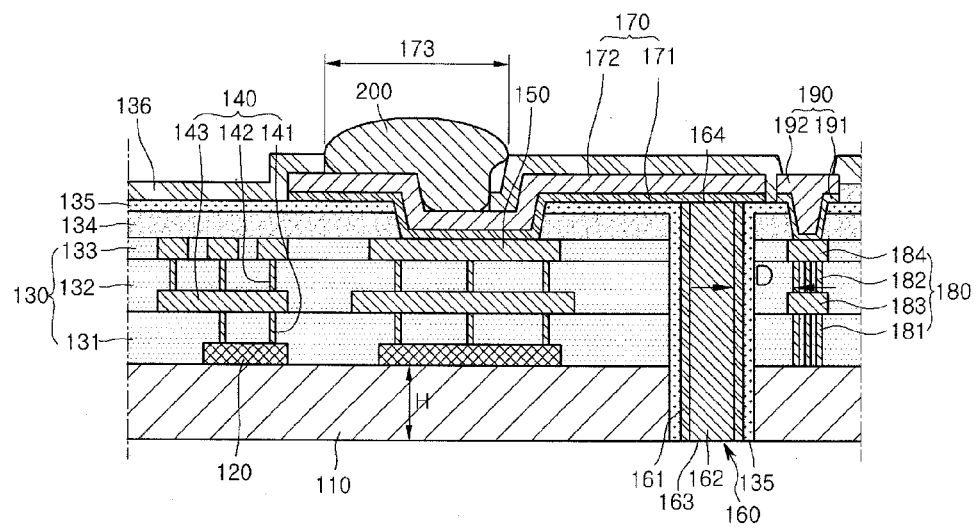
Figure 3:
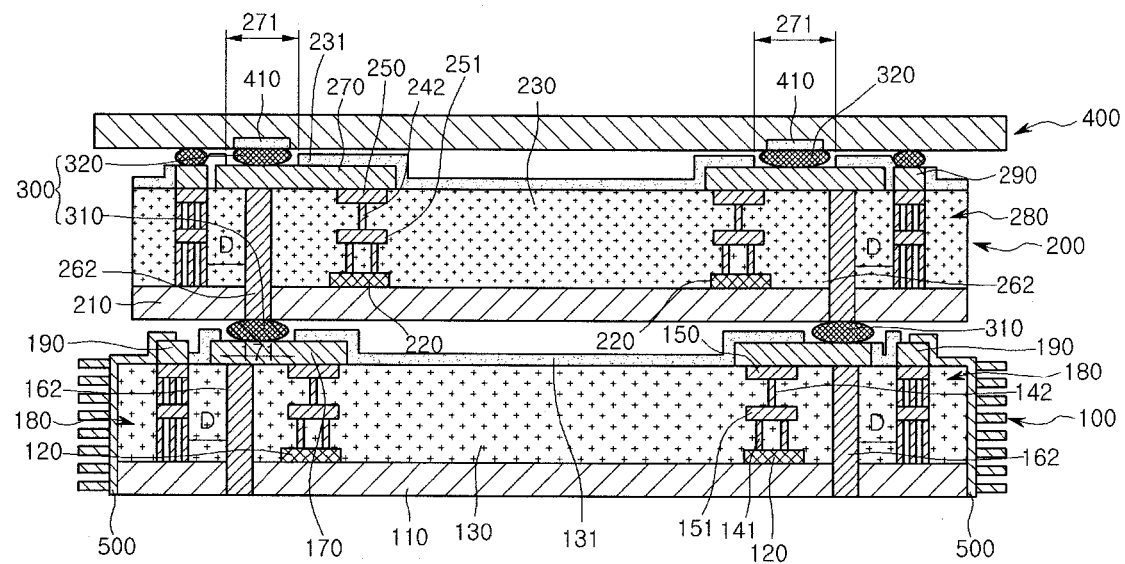

Example FIGS. 1 to 3 illustrate a semiconductor chip, a method of fabricating the semiconductor chip and a semiconductor chip stacked package including the semiconductor chip in accordance with embodiments.

DESCRIPTION

As illustrated in example FIG. 1, the semiconductor chip In accordance with embodiments includes silicon wafer 110 and semiconductor device 120 provided and/or over wafer 110, insulating layer 130, wiring structure 140, upper metal 150, first and second protective layers 134 and 136, deep via hold 160, buffer layer 135, barrier metal 161, deep via 162, redistribution layer (RDL) 170, heat dissipation structure 180 and a heat transferring metal layer 190.

Silicon wafer 110 may have a rectangular geometric shape. Silicon wafer 110 may be composed of single crystal silicon having a thickness in a range between about 40 μm to 60 μm. Semiconductor device 120 is formed on and/or over silicon wafer 110 and may be formed as at least one of a DMOS transistor, a CMOS transistor, a bijunction transistor, a diode and the like. Semiconductor device 120 can include a gate electrode, a source electrode, a drain electrode, and a channel region, etc. Insulating layer 130 is formed on and/or over silicon wafer 110 including semiconductor device 120. Insulating layer 130 may be composed of at least one of borophospho silicate glass (BPSG) and tetra othosilicate (TEOS) and the like. Insulating layer 130 may be formed of a multi-layered structure including first insulating layer 131, second insulating layer 132 and third insulating layer 133. First insulating layer 131 is formed to cover and insulate semiconductor device 120. Second insulating layer 132 is formed on and/or over first insulting layer 131 including an underlying lower wiring 143 described below. Third insulating layer 133 is formed on and/or over second insulating layer 132 in order to insulate lateral sidewalls of upper metal 150.

Wiring structure 140 is provided to electrically connect semiconductor device 120 and upper metal 150. Wiring structure 140 may be composed of a metal such as copper or tungsten and the like. Wiring structure 140 includes first via 141, lower wiring 143 and second via 142. First via 141 penetrates first insulating layer 131 and is electrically connected to semiconductor device 120. Lower wiring 143 is formed on and/or over first insulting layer 131 and is electrically connected to first via 141. Accordingly, semiconductor device 120 and lower wiring 143 are electrically connected by first via 141. Second via 142 penetrates second insulating layer 132 and is electrically connected to lower wiring 143. Upper metal 150 is formed on and/or over second insulating layer 132 and is electrically connected to second via 142. Accordingly, semiconductor device 120 and upper metal 150 are electrically connected by wiring structure 140. Upper metal 150 may be composed of at least one of copper (Cu), tungsten (W), aluminum (Al) and the like.

First protective layer 134 is formed on and/or over third insulating layer 133 including upper metal 150 and second heat transferring member 184 described below. First protective layer 134 includes a first hole exposing a portion of the uppermost surface of upper metal 150 and a second hole exposing a portion of the uppermost surface of second heat transferring member 184. First protective layer 134 may be composed of a nitride material and have a thickness in a range of about 2000 Å to about 3000 Å. Deep via hole 160 penetrates silicon wafer 110, first insulating layer 131, second insulating layer 132, third insulating layer 133 and first protective layer 134. The diameter of deep via hole 160 is in arrange between about 10 μm to about 30 μm. Buffer layer 135 is disposed on and/or over an uppermost surface of first protective layer 134 and sidewalls of deep via hole 160. Buffer layer 135 may be composed of an oxide material. Buffer layer 135 includes a third hole exposing a portion of the uppermost surface of upper metal 150 and a fourth hole exposing the uppermost surface of second heat transferring member 184. Buffer layer 135 serves to prevents diffusion of material included in deep via 162 into insulating layer 130 or silicon water 110. Barrier metal 161 is disposed on and/or over buffer layer 135 in deep via hole 160 as second barrier preventing diffusion of material included in deep via 162 into insulating layer 130 or silicon water 110. Deep via 162 is disposed in deep via hole 160 and may be composed of at least one of copper, copper alloy, tungsten, and silver, etc. Deep via 162 can have, for example, a column shape or cylindrical geometric shape.

Deep via 162 has first end 163 and second end 164, first end 163 being exposed and second end 164 being covered by RDL 179. RDL 170 is disposed on and/or over buffer layer 135 including second end 164 of deep via 162 and the portion of upper metal 150 exposed by the first hole and the third hole. RDL 179 is electrically connected to deep via 162 and upper metal 150. RDL 170 may have a multilayer structure including first RDL 171 and second RDL 172. First RDL 171 is formed directly on first end 163 of deep via 162 and the portion of upper metal 150 exposed by the first hole and the third hole. First RDL 171 serves to prevent diffusion of a metal used as second RDL 172 into upper metal 150 and deep via 162. First RDL 171 can be composed of a metal material such as at least one of titanium, titanium nitride, titanium silicon nitride, tantalum, tantalum nitride, and tantalum silicon nitride, etc. First RDL 171 performs a buffer function between second RDL 172 and deep via 162, and thus, indirectly connects second RDL 172 and deep via 162. Second RDL 172 is formed stacked on and/or over first RDL 171. Second RDL 172 can be composed of a metal such as aluminum and aluminum alloys. RDL 170 includes pad portion 173 exposed to the outside. Pad portion 173 is a region where an uppermost surface of RDL 170 is exposed by removing a portion of second protective layer 136. Pad portion 173 may be formed in a predetermined position regardless of the respective spatial positioning of deep via 160 and upper metal 150. The semiconductor chip in accordance with embodiments may be connected to another semiconductor chip through a conductive member such as bump 200 connected to pad portion 173. Second protective layer 136 is formed on and/or over RDL 170 and includes a hole exposing pad portion 173. Second protective 136 serves to protect RDL 170 and wiring structure 140.

Heat dissipation structure 180 transfers heat generated by deep via 162 to the outside of the semiconductor chip. For example, heat dissipation structure 180 may transfer the heat to a printed circuit board (PCB) connected to the semiconductor chip or a heat sink disposed outside the semiconductor chip. Heat dissipation structure 180 includes first heat dissipation member 181, second heat dissipation member 182, first heat transferring member 183 and second heat transferring member 184.

First heat dissipation member 181 absorbs heat generated by deep via 162 and may be formed, for example, as a via formed extending through first insulating layer 130. First heat dissipation member 181 is spaced a predetermined interval (D) from deep via 162 and formed in parallel to deep via 162. The predetermined interval (D) may be in a range of about 2 μm to 5 μm. A plurality of vias serving as heat dissipation members may be disposed around deep via 162. On the other hand, first heat dissipation member 181 can be formed to enclose deep via 162. Second heat dissipation member 182 also absorbs heat from deep via 162 and may be formed, for example, as a via formed to extending through second insulating layer 132. Second heat dissipation member 182 is spaced a predetermined interval (D) from deep via 162 and formed in parallel with deep via 162. The predetermined interval (D) may be in a range of about 2 μm to 5 μm. A plurality of vias serving as second heat dissipation members may be disposed around the deep via 162. On the other hand, second heat dissipation member 182 can be formed to enclose deep via 162.

First heat transferring member 183 is disposed on and/or over first insulating layer 131 and connected to or otherwise contacts first heat dissipation member 181 and second heat dissipation member 182. First heat transferring member 183 transfers the heat absorbed by first heat dissipation member 181 to second dissipation member 182. Also, first heat transferring member 183 absorbs the heat generated by deep via 162. When first heat dissipation member 181 and second heat dissipation member 182 are a plurality of vias, the vias may be connected to a single first heat transferring member 183. Second heat transferring member 184 is disposed on and/or over second insulating layer 132 and is connected to or otherwise contacts second dissipation member 182. Second heat transferring member 184 transfers the heat absorbed by first heat dissipation member 181, second heat dissipation member 182 and first heat transferring member 183 to heat transferring metal layer 190.

Heat transferring metal layer 190 is formed on and/or over and contacts an uppermost surface of second heat transferring member 184. Heat transferring metal layer 190 transfers the heat transferred from second heat transferring member 184 to a PCB or an external heat sink. Heat transferring metal layer 190 includes first heat transferring metal layer 191 and second heat transferring metal layer 192. First heat transferring metal layer 191 may be composed of the same material used for first RDL 171. First heat transferring metal layer 191 is formed and/or over and contacts the uppermost surface of second heat transferring member 184. Second heat transferring metal layer 192 is formed on and/or over first transferring metal layer 191. Second heat transferring metal layer 192 may be composed of the same material as second RDL 172.

In operation, a plurality of electrical signals are applied to deep via 162 to generate heat therein. Heat dissipation structure 180 can efficiently transfer the heat to the outside, thereby making it possible to improve performance and durability of the semiconductor chip.

Example FIGS. 2A to 2H illustrates a method of fabricating the semiconductor chip in accordance with embodiments.

As illustrated in example FIG. 2A, a plurality of semiconductor devices 120 are formed on and/or over silicon wafer 110. An insulating layer 131 covering semiconductor devices 120 is then formed. Insulating layer 131 can be composed of a material such as BPSG, TEOS, etc. After insulating layer 131 is formed, via holes penetrating insulating layer 131 are formed through a mask process and then filled with a metal material. Thereafter, the metal material and insulating layer 131 are planarized by a chemical mechanical polishing (CMP) process to form first via 141 and first heat dissipation member 181. A metal layer is then formed on and/or over first insulating layer 131 and is patterned by a mask process to form lower wiring 143 and first heat transferring member 183 on and/or over first insulating layer 131.

After lower wiring 143 and first heat transferring member 183 are formed, second insulating layer 132 is formed on and/or over first insulating layer 131 by a chemical vapor deposition process, etc. Second insulating layer 132 may be composed of the same material used as first insulating layer 131. Next, via holes penetrating second insulting layer 132 are formed and then filled with a metal material. Second insulating layer 132 and the metal material are then polished and planarized by a CMP process to form second via 142 and second heat dissipation member 182 penetrating second insulating layer 132.

Thereafter, a metal layer is formed on and/or over second insulating layer 132 and then patterned by a mask process. A preliminary upper metal and preliminary second heat transferring member are formed on and/or over second insulating layer 132. Next, third insulating layer 133 is formed on and/or over the preliminary upper metal and the preliminary second heat transferring member. The preliminary upper metal, the preliminary second heat transferring member and third insulating layer 133 are planarized by a CMP process to form upper metal layer 150 and second heat transferring member 184 and also expose the uppermost surfaces thereof. Upper metal layer 150 and second heat transferring member 184 may be composed of a metal such as copper (Cu), tungsten (W), etc.

As illustrated in example FIG. 2B, after forming upper metal layer 150 and second heat transferring member 184, first protective layer 134a is formed on and/or over upper metal 150, second heat transferring member 184 and third insulating layer 133 is formed. First protective layer 134a may be composed of a nitride material and formed by a chemical vapor deposition (CVD) process at a thickness in a range of about 700 Å to 2000 Å.

As illustrated in example FIG. 2C, after first protective layer 134a is formed, via hole 160 is formed penetrating through first insulating layer 131, second insulating layer 132, third insulating layer 133, first protective layer 134a and a portion of wafer 110. In order to form deep via hole 160, a photoresist film is formed on and/or over first protective layer 134a having a thickness of about 2 to 5 μm and an etching selectivity of 90:1. The thickness ratio of the photoresist film to first, second and third insulating layers 131, 132, and 133 and silicon wafer 110 removed by etchant is 1:90. The photoresist film is patterned by a photo process including an exposure process and a development process so that a photoresist pattern is formed on first protective layer 134a. A portion of silicon wafer 110, first insulating layer 131, second insulating layer 132, third insulating layer 133 and first protective layer 134a are patterned using the photoresist pattern as an etch mask to form deep via hole 160 having a diameter of about 10 to 30 μm and a depth of 50 μm or more.

As illustrated in example FIG. 2D, after deep via hole 160 is formed, buffer layer 135a is formed on and/or over an uppermost surface of first protective layer 134a and inner sidewalls of deep via hole 160. Buffer layer 135a can be composed of an oxide material such as silicon oxide ($SiO_x$) and formed having a thickness of 2000 to 3000 Å. Buffer layer 135a can alternatively be formed of TEOS, silicon nitride ($SiN_x$, and silicon carbide ($SiC_x$), etc. After buffer layer 135a is formed, barrier metal film 161a is formed thereon and/or thereover. Barrier metal film 161a can be composed of a metal such as titanium (Ti), titanium nitride (TiN), titanium silicon (TiSiN), tantalum (Ta), tantalum nitride (TaN), and tantalum silicon nitride (TaSiN), etc. Barrier metal film 161a may be formed by a PE-CVD process at a temperature of about 100 to 700° C., a voltage of 200V to 2000V, and a pressure of 30 mTorr to 100 mTorr. After barrier metal film 161a is formed, deep via metal 162a is formed on and/or over barrier metal film 161a and inside deep via hole 160. Deep via metal 162a can be composed of at least one of copper, copper alloy, tungsten, polysilicon, and silver, etc.

As illustrated in example FIG. 2E, after deep via metal 162a is formed, a portion of deep via metal 162a is removed by a process such as an etch back, etc. Thereafter, a portion of buffer layer 135a formed on and/or over first protective layer 134a, barrier metal film 161a formed on and/or over buffer layer 135a, and deep via metal 162a formed on and/or over nitride film 134a are removed by a CMP process to planarized second protective layer 135a form barrier metal 161 and deep via 162.

As illustrated in example FIG. 2F, after barrier metal 161 and deep via 162 are formed, buffer layer 135 and first protective layer 134 are patterned to expose a portion of the uppermost surface of upper metal 150 and second heat transferring member 184.

As illustrated in example FIG. 2G, a first wiring metal film is formed on and/or over buffer film 135. The first wiring metal film can be composed of a metal such as at least one of titanium, titanium nitride, titanium silicon nitride, tantalum, tantalum nitride, and tantalum silicon nitride, etc. Thereafter, a second wiring metal film is formed on and/or over the first wiring metal film. The second wiring metal film can be composed of a metal such as at least one of aluminum, aluminum alloys, etc. The first wiring metal film and the second wiring metal film are patterned through the mask process to simultaneously form RDL 170 on and/or over the exposed upper metal 150 and second end 164 of the exposed deep via 162 and also heat transferring metal layer 190 including first heat transferring metal layer 191 formed on and/or over second heat transferring member 184 and second heat transferring metal layer 192 formed on and/or over first heat transferring metal layer 191.

As illustrated in example FIG. 2H, after RDL 170 and heat transferring metal layer 190 are formed, second protective layer 136 is formed on and/or over RDL 170. Thereafter, a lowermost portion of silicon wafer 110, buffer layer 135, barrier metal 161 and deep via 162 are etched to expose first end 163 of deep via 162. The thickness (H) of remaining silicon wafer 110 is about 40 μm to 60 μm. The etching can be performed by a back grinding process. The etchant material can include at least one of potassium hydroxide (KOH) and tetra methyl ammonium hydroxide (TMAH).

Example FIG. 3 illustrates a stacked semiconductor chip package including semiconductor chips manufactured in accordance with embodiments. The semiconductor chip stacked package includes first semiconductor chip 100, second semiconductor chip 200, bump 300, circuit board 400 and heat sink 500. First semiconductor chip 100 includes first silicon wafer 110, first semiconductor device 120, insulating layer 130, first upper metal 150, first deep via 162, first heat dissipation structure 180, first RDL 170 and heat transferring metal layer 190. An example of a material capable of being used as first silicon wafer 110 can includes single crystalline silicon, etc. First semiconductor device 120 is formed on and/or over first silicon wafer 110. Insulating layer 130 of first semiconductor chip 100 is formed to cover first semiconductor device 120. First upper metal 150 is formed on and/or over insulating layer 130 and is electrically connected to first semiconductor device 120 through vias 141 and 142 penetrating through insulating layer 130 and wirings 151 disposed between insulating layers 130. First deep via 162 penetrates insulating layer 130 and first silicon wafer 110 and an end of first deep via 162 is exposed. First heat dissipation structure 180 is disposed spaced at a predetermined interval (D) from first deep via 162, and is disposed inside semiconductor chip 100. First RDL 170 covers an end of first deep 162 via opposite to the exposed end, and also covers a portion or the whole of first top metal 150. First RDL 170 is electrically connected to first deep via 162 and first upper metal 150. Also, first protective layer 131 covers first RDL 170 and also exposes a portion of an uppermost surface of first RDL 170 to form first pad portion 171. Heat transferring metal layer 190 is connected to first heat dissipation structure 180 to transfer heat transferred through first heat dissipation structure 180 to heat sink 500.

Second semiconductor chip 200 is disposed on and/or over first semiconductor chip 100. Second semiconductor chip 200 includes second silicon wafer 210, second semiconductor device 220, second insulating layer 230, second upper metal 250, second deep via 262, second heat dissipation structure 280, second RDL 272 and heat transferring metal layer 290. An example of a material capable of being used as second silicon wafer 210 can include single crystalline silicon, etc. Second semiconductor device 220 is formed on and/or over second silicon wafer 210 and insulating layer 230 is formed to cover second semiconductor device 220. Second upper metal 250 is formed on and/or over insulating layer 230 and is electrically connected to second semiconductor device 220 through vias 241 and 242 penetrating insulating layer 230 and wirings 251 disposed between insulating layers 230. Second deep via 262 penetrates insulating layer 230 and second silicon wafer 210 such that one end of second deep via 262 contacts bump 300 and is electrically connected thereto. Second RDL 270 covers an end of second deep via 262 opposite to the end electrically connected to bump 300 and also covers a portion of second top metal 250. Second RDL 270 is electrically connected to second deep via 262 and second top metal 250. Second protective layer 232 covers second RDL 270 and exposes a portion of an uppermost surface of second RDL 270 to form second pad portion 271. Heat transferring metal layer 290 is connected to second heat discharing structure 280 to transfer heat transferred through second heat dissipation structure 280 to circuit board 400.

Bump 300 includes first bump 310 and second bump 320. First bump 310 is interposed between first semiconductor chip 100 and second semiconductor chip 200. More specifically, first bump 310 is disposed on first RDL 170 to be electrically connected to first RDL 107 and is electrically connected to second deep via 262. That is, first bump 310 electrically connects first semiconductor chip 100 and second semiconductor chip 200. First bump 310 is disposed on and/or over first pad portion 171 to contact first pad portion 171. Second bump 320 is interposed between second semiconductor chip 200 and circuit board 400 described below. Second bump 320 is electrically connected to second RDL 270 and pad portion 410 of circuit board 400 to electrically connect second semiconductor chip 200 and circuit board 400. Second bump 320 is disposed on and/or over second pad portion 271 to contact second pad portion 271 and also heat transferring metal layer 290 to transfer heat transferred through heat transferring metal layer 290 to circuit board 400. Bump 300 can include at least one of tin lead (SnPb), gold (Au), copper (Cu), and silver (Ag). Bump 300 can be solder paste.

Circuit board 400 is disposed on and/or over second semiconductor chip 200 and includes printed wirings therein. Circuit board 400 includes a pad portion exposed to the outside and may also include a heat fin, etc., for easily dissipating heat to the outside. Heat sink 500 is disposed on and/or over a side of first semiconductor chip 100 and contact heat transferring metal layer 190. Heat sink 500 includes a heat fin increasing contact area with air, and discharges the heat transferred from heat transferring metal layer 190 to the air.

Accordingly, with the semiconductor chip stacked package in accordance with embodiments, it is possible to efficiently discharge inside heat to the outside. In accordance with embodiments, the semiconductor chip stacked package may permit positioning first and second bumps 310 and 320 at a desired position regardless of the relative positions of first and second deep vias 162 and 262 and first and second upper metals 150 and 250. Therefore, such a semiconductor chip stacked package it is possible to prevent reduction in reliability due to overheating while enhancing the degree of freedom of design.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor chip comprising:
a wafer;
a semiconductor device disposed on the wafer;
a first insulating layer formed on the wafer including the semiconductor device;
a second insulating layer on the first insulating layer;
a deep via formed penetrating through the wafer, the first insulating layer, and the second insulating layer; and
a heat dissipation member spaced a predetermined distance from the deep via and penetrating at least a portion of the first and second insulating layers for dissipating heat generated by the deep via,
wherein the heat dissipation member includes:
a plurality of first vias penetrating through the first insulating layer;
a first heat transferring member disposed on the first insulating layer and connected to the first vias;
a plurality of second vias penetrating through the second insulating layer and being connected to the first heat transferring member; and
a second heat transferring member disposed on the second insulating layer and connected to the second vias.

2. The semiconductor chip of claim 1, further comprising a buffer layer formed on and covering the deep via.

3. The semiconductor chip of claim 1, further comprising a redistribution layer formed on a distal end of the deep via and electrically connected to the deep via and the semiconductor device.

4. The semiconductor chip of claim 3, wherein the redistribution layer comprises a first redistribution layer formed on the deep via and a second redistribution layer formed on the first redistribution layer.

5. The semiconductor chip of claim 1, wherein the predetermined distance is in a range between 2 μm to 5 μm.

* * * * *